(12) United States Patent
Kang

(10) Patent No.: US 8,278,223 B2
(45) Date of Patent: Oct. 2, 2012

(54) METHOD FOR FORMING HOLE PATTERN

(75) Inventor: Sang-Kil Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 199 days.

(21) Appl. No.: 12/777,758

(22) Filed: May 11, 2010

(65) Prior Publication Data

US 2011/0177691 A1 Jul. 21, 2011

(30) Foreign Application Priority Data

Jan. 15, 2010 (KR) ........................ 10-2010-0004059

(51) Int. Cl.
*H01L 21/302* (2006.01)

(52) U.S. Cl. ......... 438/736; 438/714; 438/725; 438/735

(58) Field of Classification Search .................. 438/700, 438/712, 714, 723, 734, 735, 747, 587, 589, 438/736, 750
See application file for complete search history.

(56) References Cited

U.S. PATENT DOCUMENTS

| 7,323,327 | B2 * | 1/2008 | Edens et al. | 435/225 |
| 7,420,244 | B2 * | 9/2008 | Yoon et al. | 257/328 |
| 2004/0192059 | A1 * | 9/2004 | Tang et al. | 438/710 |
| 2007/0119813 | A1 * | 5/2007 | Celii et al. | 216/41 |
| 2009/0269924 | A1 * | 10/2009 | Choi et al. | 438/669 |
| 2009/0271758 | A1 * | 10/2009 | Wells | 716/19 |
| 2009/0283912 | A1 * | 11/2009 | Akinmade-Yusuff et al. | 257/758 |
| 2010/0248153 | A1 * | 9/2010 | Lee et al. | 430/312 |

FOREIGN PATENT DOCUMENTS

| KR | 1020060041415 | 5/2006 |
| KR | 1020100001814 | 1/2010 |

OTHER PUBLICATIONS

Notice of Allowance issued by the Korean Intellectual Property Office on Nov. 29, 2011.

* cited by examiner

*Primary Examiner* — Lan Vinh
(74) *Attorney, Agent, or Firm* — IP & T Group LLP

(57) ABSTRACT

A method for forming a hole pattern includes forming a hard mask layer for a hole pattern over an etch target layer, forming pillar patterns having a gap therebetween over the hard mask layer for a hole pattern, forming spacer patterns on sidewalls of the pillar patterns, removing the pillar patterns between the spacer patterns, and etching the hard mask layer for a hole pattern by using the spacer patterns as etch barriers.

20 Claims, 5 Drawing Sheets

METHOD FOR FORMING HOLE PATTERN

CROSS-REFERENCE TO RELATED APPLICATIONS

The present application claims priority of Korean Patent Application No. 10-2010-0004059, filed on Jan. 15, 2010, which is incorporated herein by reference in its entirety.

BACKGROUND OF THE INVENTION

Exemplary embodiments of the present invention relate to a method for fabricating a semiconductor device, and more particularly, to a method for forming a hole pattern in a semiconductor device.

As the integration of a semiconductor device drives decreases in size of features, the size of a hole pattern is decreasing as well. As the sizes of a semiconductor device further decrease, it is required to develop a patterning technology that overcomes the limitations in the analysis capability of current exposure equipment.

Meanwhile, highly integrated semiconductor devices also reduce the line width, which is also referred to as critical dimension, of storage nodes. However, current mask patterning technology cannot be used for patterning of a next-generation semiconductor device. To overcome the limitation, a patterning method of alternately performing a spacer patterning technology (SPT) process twice has been suggested.

However, the patterning method of alternately performing an SPT process twice has too many factors involving in the control of line width and uniformity, and its patterning performance is poor due to selectivity between stacks. Also, when double patterning technology (DPT) is used to perform a patterning process, line width of a desired dimension is hardly acquired due to limitation in analysis capacity of line patterning.

Therefore, it is required to develop a method that can overcome the limitation of a mask and form a micro hole pattern.

SUMMARY OF THE INVENTION

An exemplary embodiment of the present invention is directed to a method for forming a hole pattern that can overcome the limitation in analysis capability of a mask pattern and form a micro hole pattern.

In accordance with an exemplary embodiment of the present invention, a method for forming a hole pattern includes forming a hard mask layer for a hole pattern over an etch target layer, forming pillar patterns having a gap therebetween over the hard mask layer, forming spacer patterns on sidewalls of the pillar patterns, removing the pillar patterns between the spacer patterns, and etching the hard mask layer by using the spacer patterns as etch barriers.

The forming of the pillar patterns may include stacking first, second and third mask layers for patterning over the hard mask layer, forming a first photoresist pattern in a first direction over the third mask layer, etching the third mask layer by using the first photoresist pattern as an etch barrier, removing the first photoresist pattern, forming an anti-reflection layer over an entire structure including the etched third mask layer, forming a second photoresist pattern in a second direction over the anti-reflection layer, forming a third mask pattern in a pillar shape by etching the anti-reflection layer and the third mask layer using the second photoresist pattern as an etch barrier, removing the second photoresist pattern and the anti-reflection layer, and forming the pillar patterns by etching the first and second mask layers forming, respectively, first and second mask patterns using the third mask pattern as an etch barrier.

The forming of the spacer patterns may include forming a spacer layer along a profile of the entire structure including the pillar patterns, and etching the spacer layer while leaving the spacer patterns behind on the sidewalls of the pillar patterns. In the etching of the spacer layer while leaving the spacer patterns behind on the sidewalls of the pillar patterns, the third mask layer and the second mask layer may be removed.

In the removing of the pillar patterns between the spacer patterns, the first mask pattern may be removed. The first mask pattern may be formed of amorphous carbon. The removal of the first mask pattern may be performed through an oxygen stripping method.

The spacer layer may be formed of a material having step coverage. The spacer layer may be an oxide layer. The spacer layer may be an ultra low temperature oxide (ULTO) layer. The spacer layer may be formed in a thickness filling a gap between neighboring pillar patterns.

The etching of the spacer layer while leaving the spacer patterns behind on the sidewalls of the pillar pattern may include a main etch process and an overetch process. The main etch process may be performed using a mixed gas of fluoroform ($CHF_3$) and difluoromethane ($CH_2F_2$). The overetch process may be performed using a mixed gas of tetrafluoromethane ($CF_4$) and $CHF_3$.

The second mask layer may be a silicon oxynitride layer, and the third mask layer may be a tetraethyl orthosilicate (TEOS) oxide layer.

The etching of the third mask layer for patterning may be performed using a mixed gas of $CF_4$ and $CHF_3$. The forming of the third mask pattern in a pillar shape by etching the anti-reflection layer and the third mask layer may be performed using a mixed gas of sulfur hexafluoride ($SF_6$) and $CHF_3$.

The forming of the pillar patterns by etching the first and second mask layers may include etching the second mask layer and etching the first mask layer. The etching of the second mask layer may be performed using a mixed gas of $CF_4$ and $CHF_3$. The etching of the first mask layer may be performed using a mixed gas of oxygen ($O_2$) and nitrogen ($N_2$). The etching of the first mask layer may be performed adding $CF_4$ to the mixed gas.

The hard mask layer for a hole pattern may have a stacked structure of a first hard mask layer and a second hard mask layer. The first hard mask layer may be formed of amorphous carbon, and the second hard mask layer of a silicon oxynitride layer.

DESCRIPTION OF EXEMPLARY EMBODIMENTS

Figure 1A:
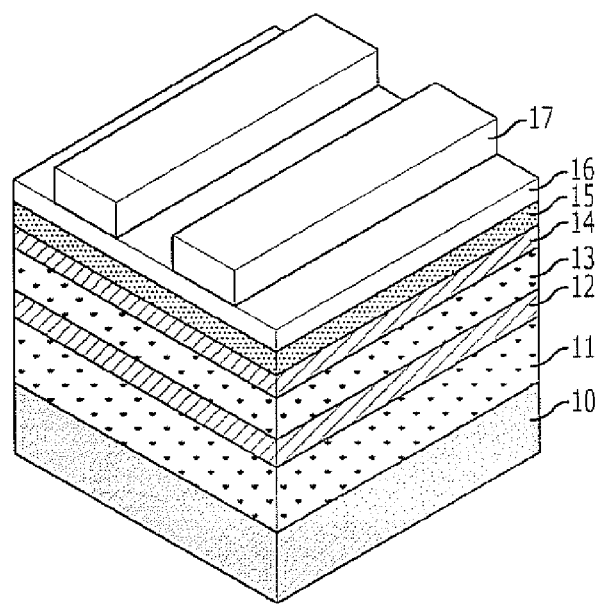
FIGS. 1A to 1N are perspective views describing a method for forming a hole pattern in accordance with an exemplary embodiment of the present invention.

Exemplary embodiments of the present invention will be described below in more detail with reference to the accompanying drawings. The present invention may, however, be embodied in different forms and should not be construed as limited to the exemplary embodiments set forth herein. Rather, these embodiments and description are provided so that this disclosure will be thorough and complete and will enable those skilled in the art to practice the invention without undue experimentation. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
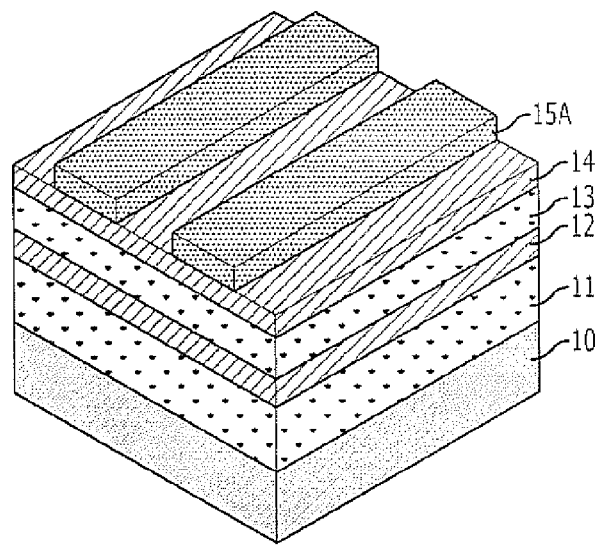
Figure 1C:
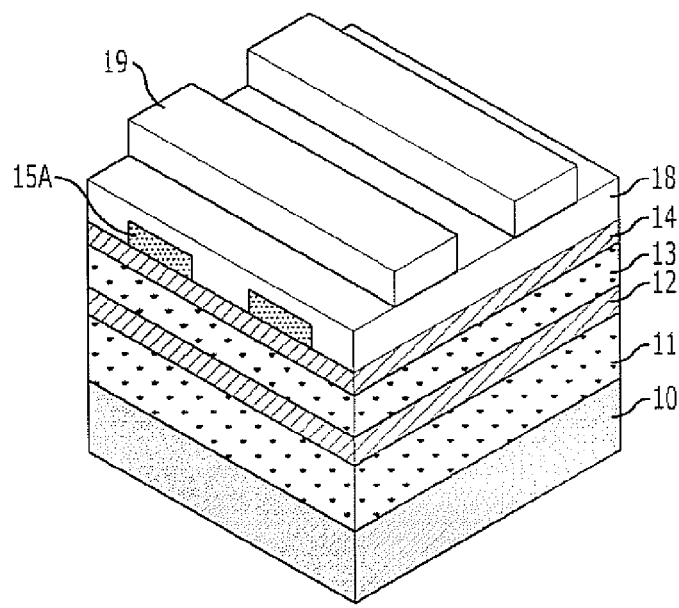
Figure 1D:
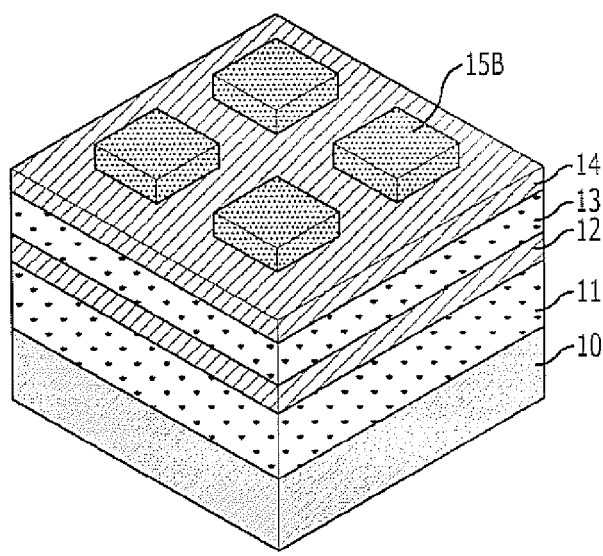
Figure 1E:
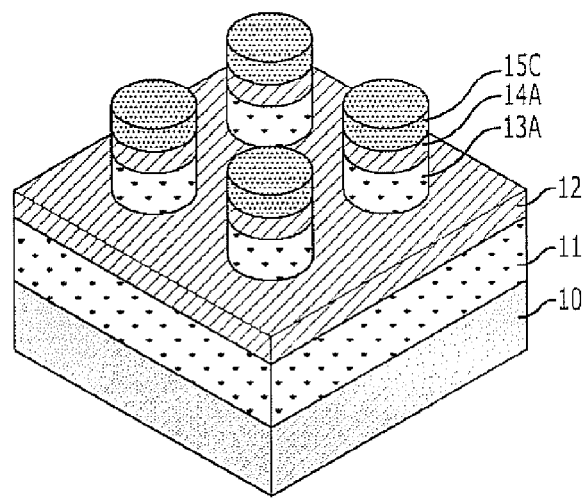
Figure 1F:
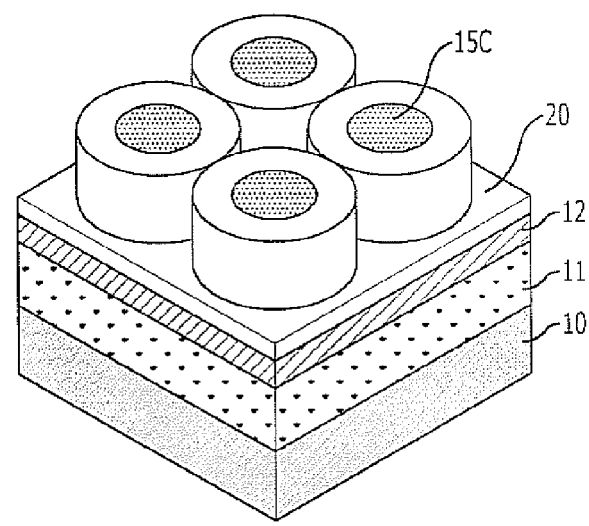
Figure 1G:
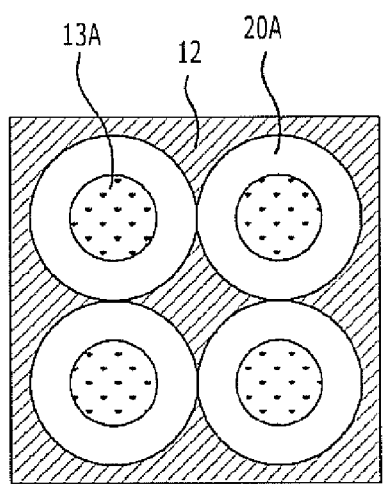
Figure 1H:
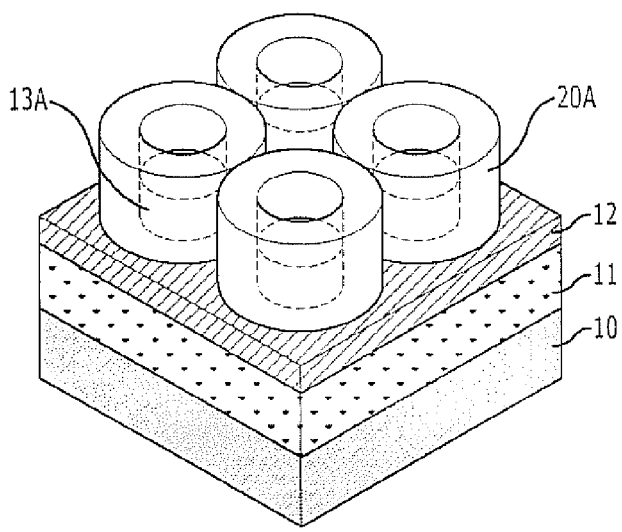
Figure 1I:
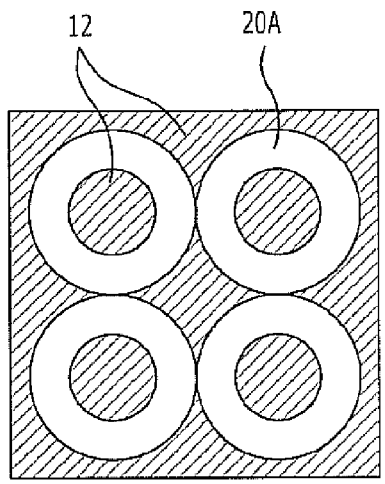
Figure 1J:
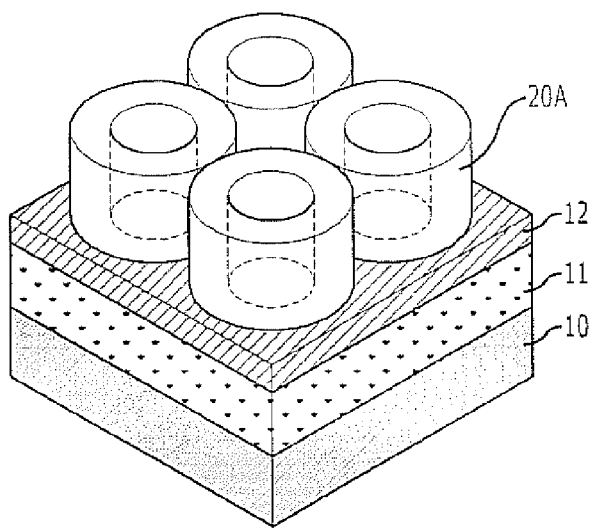
Figure 1K:
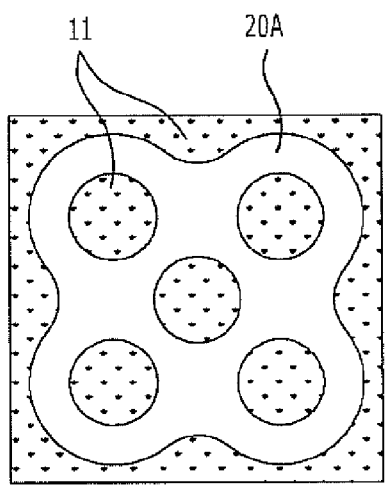
Figure 1L:
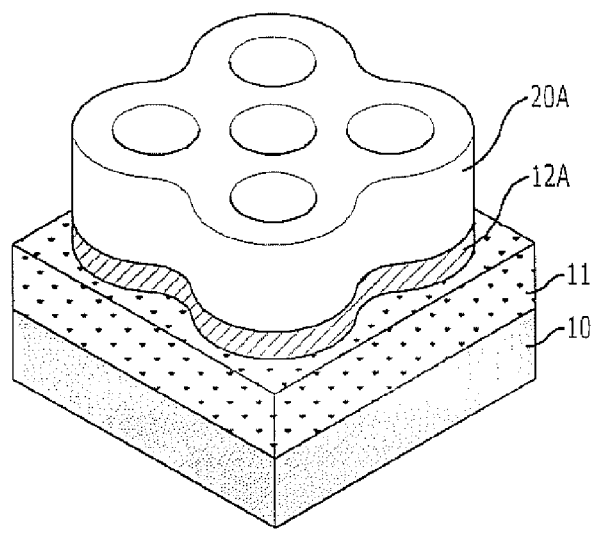
Figure 1M:
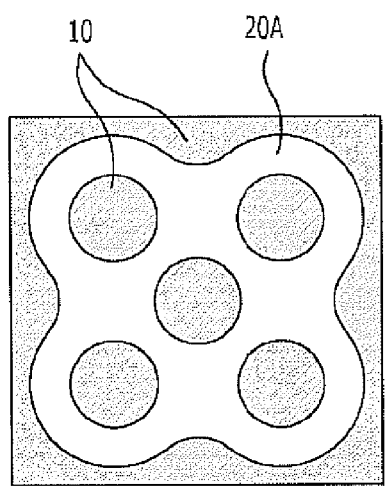
Figure 1N:
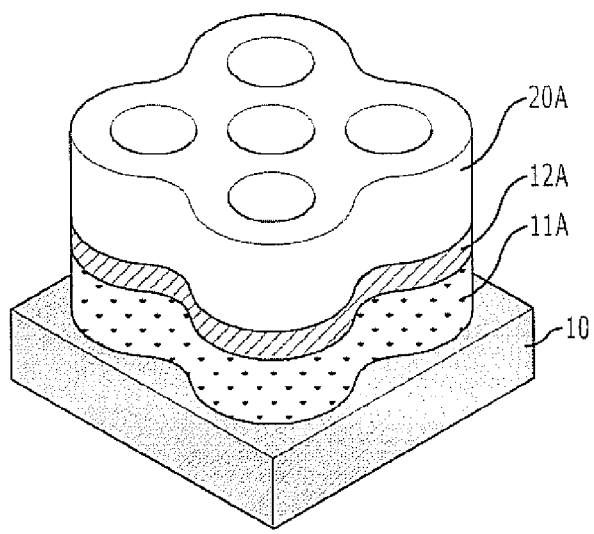

FIGS. 1A to 1N are perspective views describing a method for forming a hole pattern in accordance with an exemplary embodiment of the present invention.

Referring to FIG. 1A, a first hard mask layer 11 for a hole pattern and a second hard mask layer 12 for a hole pattern are stacked over an etch target layer 10. The first hard mask layer 11 for a hole pattern and the second hard mask layer 12 for a hole pattern serve as hard masks for forming a hole pattern by etching the etch target layer 10 in a subsequent process. The first hard mask layer 11 for a hole pattern may be formed of amorphous carbon, and the second hard mask layer 12 for a hole pattern may be formed of a silicon oxynitride (SION).

The etch target layer 10 is a layer for forming a hole pattern. When a storage node is formed, the etch target layer 10 may be formed of an oxide layer.

Subsequently, a first mask layer 13 for patterning, a second mask layer 14 for patterning, and a third mask layer 15 for patterning are stacked over the second hard mask layer 12 for a hole pattern. The first to third mask layers for patterning are mask layers for performing a patterning process to form a micro hole pattern. The first mask layer 13 for patterning may be formed of amorphous carbon, and the second mask layer 14 for patterning may be formed of silicon oxynitride (SION), while the third mask layer 15 for patterning may be formed of an oxide layer. Herein, the oxide layer includes a TEOS oxide layer.

Subsequently, a first anti-reflection layer 16 is formed over the third mask layer 15 for patterning.

Subsequently, a first photoresist pattern 17 is formed over the first anti-reflection layer 16. The first photoresist pattern 17 is formed in a line pattern stretched in a first direction. Since a pattern is laid between pillars in a subsequent process, that is, since the pattern is formed in the gap between the first photoresist patterns 17, the gap between the first photoresist patterns 17 may be formed wide. Therefore, the patterning process for forming the first photoresist pattern 17 may be performed easily.

Referring to FIG. 1B, the first anti-reflection layer 16 (see FIG. 1A) and the third mask layer 15 for patterning (see FIG. 1A) are etched using the first photoresist pattern 17 as an etch barrier. As a result, a third mask pattern 15A for patterning having the same line width and space as the first photoresist pattern 17 is formed. When the third mask layer 15 for patterning (see FIG. 1A) is a TEOS oxide layer, $CF_4$ and $CHF_3$ may be used as an etch gas.

Subsequently, the first photoresist pattern 17 (see FIG. 1A) and the first anti-reflection layer 16 (see FIG. 1A) are removed. The removal of the first photoresist pattern 17 (see FIG. 1A) and the first anti-reflection layer 16 (see FIG. 1A) may be performed through a dry stripping method, which may be performed as an oxygen stripping process.

Referring to FIG. 1C, a second anti-reflection layer 18 is formed over the second mask layer 14 for patterning which includes the third mask pattern 15A for patterning. The second anti-reflection layer 18 functions as an anti-reflector and planarizes the surface by filling the gap between the third mask patterns 15A for patterning when a second photoresist pattern 19 is formed in a subsequent process. Since a gap-fill process does not have to be performed additionally, process margins are secured.

Subsequently, a second photoresist pattern 19 is formed over the second anti-reflection layer 18. The second photoresist pattern 19 is formed in a line pattern stretched in a second direction which is perpendicular to the third mask pattern 15A for patterning. Also, the gap between the second photoresist pattern 19 is formed the same as the gap between the third mask pattern 15A for patterning. Since the gap between the second photoresist patterns 19 may also be formed wide, the patterning process can be performed easily.

The region where the second photoresist pattern 19 and the third mask pattern 15A for patterning are crossed is a region where a pillar is to be formed in a subsequent process. In the region where none of the second photoresist pattern 19 and the third mask pattern 15A for patterning is laid, an additional pattern is formed in a subsequent process.

Referring to FIG. 1D, the second anti-reflection layer 18 (see FIG. 1C) and the third mask pattern 15A for patterning (see FIG. 1C) are etched using the second photoresist pattern 19 (see FIG. 1C) as an etch barrier. Since the etch barrier is the second photoresist pattern 19 (see FIG. 1C) that is patterned in a line pattern stretched in the second direction which is perpendicular to the third mask pattern 15A for patterning, an etched third mask pattern 15B for patterning acquired after the etch process has a square pillar shape as the crossed portion remains.

The second anti-reflection layer 18 (see FIG. 1C) and the etched third mask pattern 15B for patterning may be etched using an etch gas having a selectivity of approximately 1:1. The etch gas may be a mixed gas of sulfur hexafluoride ($SF_6$) and trifluoromethane ($CHF_3$).

Subsequently, the second photoresist pattern 19 (see FIG. 1C) and the second anti-reflection layer 18 (see FIG. 1C) are removed. The removal of the second photoresist pattern 19 (see FIG. 1C) and the second anti-reflection layer 18 (see FIG. 1C) may be performed through a dry stripping method, which may be an oxygen stripping process.

Referring to FIG. 1E, the second mask layer 14 for patterning (see FIG. 1D) and the first mask layer 13 for patterning (see FIG. 1D) are etched using the etched third mask pattern 15B for patterning (see FIG. 1D) as an etch barrier. When the second mask layer 14 for patterning (see FIG. 1D) is a silicon oxynitride layer, it is etched using a mixed gas of tetrafluoromethane ($CF_4$) and fluoroform ($CHF_3$).

When the first mask layer 13 for patterning (see FIG. 1D) is formed of amorphous carbon, it may be etched using a mixed gas of oxygen ($O_2$) and nitrogen ($N_2$) as a basic etch gas. Also, when the first mask layer 13 for patterning (see FIG. 1D) is etched, $CF_4$ gas may be added to the basic etch gas.

When the first mask layer 13 for patterning is etched, the etched third mask pattern 15B for patterning (see FIG. 1D) and the second mask layer 14 for patterning (see FIG. 1D) may be attacked. In particular, the edge portions are attacked earliest and lost most. As a result, the pattern is modified into a circular shape. Herein, the etched third mask pattern 15B for patterning with its edges lost will be referred to as an edge-lost third mask pattern 15C for patterning, and the etched second mask layer 14 for patterning will be referred to as a second mask pattern 14A for patterning. The etched first mask layer 13 for patterning will be referred to as a first mask pattern 13A for patterning.

Therefore, the edge-lost third mask pattern 15C for patterning, the second mask pattern 14A for patterning, and the first mask pattern 13A for patterning are formed in pillar pattern.

Referring to FIG. 1F, a spacer 20 is formed along the profile of the entire structure which includes the pillar pattern with the first mask pattern 13A for patterning, the second mask pattern 14A for patterning, and the edge-lost third mask pattern 15C for patterning stacked therein.

The spacer 20 is formed in a thickness filling the gap between neighboring pillar patterns and it is formed of a material with excellent step coverage. Also, the spacer 20 is formed based on Chemical Vapor Deposition (CVD) or Atomic Layer Deposition (ALD) at a low temperature ranging from a room temperature to approximately 500° C. Also, the spacer 20 is formed of a material having a selectivity with respect to the first mask pattern 13A for patterning, the second mask pattern 14A for patterning and the edge-lost third mask pattern 15C for patterning, and the second hard mask layer 12 for a hole pattern. The spacer 20 is formed of an oxide layer, and it may be formed of an ultra low temperature oxide (ULTO) layer according to one embodiment.

Since the spacer 20 is formed at a lower temperature than a baking temperature of the first mask pattern 13A for patterning, which is formed of amorphous carbon, it can be formed without causing distortion or deformation of a mask pattern. Also, it is possible to control the thickness uniformity within approximately 2 nm. Since the thickness can be controlled on the basis of approximately 10 Å, it is possible to delicately adjust the line width, which is also referred to as critical dimension, of the additional pattern formed between the pillar patterns.

Referring to FIGS. 1G, 1H, 1I and 1J, a spacer pattern 20A remaining only on the sidewalls of the pillar pattern is formed by etching the spacer 20 (see FIG. 1F). In other words, the spacer 20 is made to remain only on the sidewalls of the pillar pattern by selectively etching the spacer 20 (see FIG. 1F) formed in the upper portion of the second hard mask layer 12 for a hole pattern, except for the spacer 20 (see FIG. 1F) formed in the upper portion of the edge-lost third mask pattern 15C for patterning (see FIG. 1F) and the sidewalls of the pillar pattern.

The process of etching the spacer 20 (see FIG. 1F) may be largely divided into a main etch process and an overetch process. First, the main etch process is performed using difluoromethane ($CHF_3$) gas as a main gas and adding $CH_2F_2$ gas to adjust selectivity.

In this way, the spacer 20 (see FIG. 1F) may be selectively etched while minimizing the attack on the second hard mask layer 12 for a hole pattern in the lower portion. In the overetch process, the edge-lost third mask pattern 15C for patterning (see FIG. 1F) and the second mask pattern 14A for patterning (see FIG. 1F) between the spacer patterns 20A are removed using a mixed gas of $CF_4$ and $CHF_3$. In particular, the etch process may be performed by controlling a bias power so as to minimize the loss of the second hard mask layer 12 for a hole pattern in the lower portion, when the edge-lost third mask pattern 15C for patterning (see FIG. 1F) and the second mask pattern 14A for patterning (see FIG. 1F) are removed in the overetch process. Since the edge-lost third mask pattern 15C for patterning (see FIG. 1F) and the second mask pattern 14A for patterning (see FIG. 1F) are positioned higher than the second hard mask layer 12 for a hole pattern, it is possible to remove the edge-lost third mask pattern 15C for patterning (see FIG. 1F) and the second mask pattern 14A for patterning (see FIG. 1F) while minimizing the loss of the second hard mask layer 12 for a hole pattern.

Therefore, the first mask pattern 13A for patterning remains between the loop-shaped spacer patterns 20A.

Referring to FIGS. 1I and 1J, the first mask pattern 13A for patterning (see FIGS. 1G, 1H, 1I and 13) is removed from the gap between the remaining loop-shaped spacer pattern 20A. When the first mask pattern 13A for patterning (see FIGS. 1G, 1H, 1I and 1J) is formed of amorphous carbon, the etch process is performed based on oxygen gas. In this way, it is possible to selectively remove the first mask pattern 13A for patterning (see FIGS. 1G, 1H, 1I and 1J) without losing the lower layer.

Therefore, the loop-shaped spacer pattern 20A remains over the second hard mask layer 12 for a hole pattern. Herein, a lozenge-shaped additional pattern is defined between the spacer patterns 20A, other than the hole pattern defined by the spacer patterns 20A.

Referring to FIGS. 1K, 1L, 1M and 1N, a second hard mask pattern 12A for a hole pattern and a first hard mask pattern 11A for a hole pattern are formed by etching the second hard mask layer 12 for a hole pattern (see FIGS. 1I and 1J) and the first hard mask layer 11 for a hole pattern (see FIGS. 1I and 1J) using the spacer pattern 20A as an etch barrier. The etch process for forming the second hard mask pattern 12A for a hole pattern and the first hard mask pattern 11A for a hole pattern is performed using the same gas as the gas used in the etch process for forming the second mask pattern 14A for patterning and the first mask pattern 13A for patterning shown in FIG. 1E.

In the course of forming the second hard mask pattern 12A for a hole pattern and the first hard mask pattern 11A for a hole pattern, the lozenge shape of the additional pattern between the spacer patterns 20A is changed into a circular shape. As a result, the second hard mask pattern 12A for a hole pattern and the first hard mask pattern 11A for a hole pattern are formed as a hard mask pattern for defining one central hole and external 4 holes.

While the second hard mask pattern 12A for a hole pattern and the first hard mask pattern 11A for a hole pattern are etched, a portion of the thickness of the spacer pattern 20A may be lost.

Subsequently, although not illustrated in the drawing, the etch target layer 10 is etched using the second hard mask pattern 12A for a hole pattern and the first hard mask pattern 11A for a hole pattern as an etch barrier to thereby form a hole pattern.

According to the technology of the present invention described above, an additional hole pattern is formed other than the hole pattern formed through a mask process. Therefore, it is advantageous in that many patterns can be formed.

The hole pattern forming method according to the exemplary embodiments of the present invention, described above, widens the gap between mask patterns to facilitate patterning. Since patterns can be additionally formed more than those defined through an etching process, processing margins can be acquired.

While the present invention has been described with respect to the exemplary embodiments, it will be apparent to those skilled in the art that various changes and modifications may be made without departing from the spirit and principles of the invention, the scope of which is defined in the appended claims and their equivalents.

What is claimed is:

1. A method for forming a hole pattern, comprising:
    forming a hard mask layer over an etch target layer;
    forming pillar patterns having a gap therebetween over the hard mask layer;
    forming spacer patterns on sidewalls of the pillar patterns;

removing the pillar patterns between the spacer patterns; and etching the hard mask layer by using the spacer patterns as etch barriers, wherein the forming of the pillar patterns comprises:

stacking first, second and third mask layers over the hard mask layer;

forming a first photoresist pattern in a first direction over the third mask layer;

etching the third mask layer by using the first photoresist pattern as an etch barrier until the second mask layer is exposed to form an etched third mask layer;

removing the first photoresist pattern;

forming an anti-reflection layer over an entire structure including the etched third mask layer;

forming a second photoresist pattern in a second direction over the anti-reflection layer;

forming a third mask pattern in a pillar shape by etching the anti-reflection layer and the etched third mask layer using the second photoresist pattern as an etch barrier until the second mask layer is exposed;

removing the second photoresist pattern and the anti-reflection layer; and forming the pillar patterns by etching the first and second mask layers forming, respectively, first and second mask patterns using the third mask pattern as an etch barrier.

2. The method of claim 1, wherein the second mask layer is a silicon oxynitride layer, and the third mask layer is a tetraethyl orthosilicate oxide layer.

3. The method of claim 1 wherein the etching of the third mask layer for patterning is performed using a mixed gas of $CF_4$ and $CHF_3$.

4. The method of claim 1, wherein the forming of the third mask pattern in a pillar shape by etching the anti-reflection layer and the third mask layer is performed using a mixed gas of sulfur hexafluoride ($SF_6$) and $CHF_3$.

5. The method of claim 1, wherein the neighboring four spacer patterns define a lozenge-shaped additional pattern.

6. The method of claim 1, wherein the hard mask layer for a hole pattern has a stacked structure of a first hard mask layer and a second hard mask layer.

7. The method of claim 6, wherein the first hard mask layer is formed of amorphous carbon and the second hard mask layer is a silicon oxynitride layer.

8. The method of claim 1, wherein the forming of the pillar patterns by etching the first and second mask layers comprises:

etching the second mask layer; and etching the first mask layer.

9. The method of claim 8, wherein the etching of the second mask layer is performed using a mixed gas of $CF_4$ and $CHF_3$.

10. The method of claim 8, wherein the etching of the first mask layer is performed using a mixed gas of oxygen ($O_2$) and nitrogen ($N_2$).

11. The method of claim 10, wherein the etching of the first mask layer is performed by adding $CF_4$ to the mixed gas.

12. The method of claim 1, wherein the forming of the spacer patterns comprises:

forming a spacer layer along a profile of the entire structure including the pillar patterns; and etching the spacer layer while leaving the spacer patterns behind on the sidewalls of the pillar patterns.

13. The method of claim 12, wherein the spacer layer is formed of a material having step coverage.

14. The method of claim 12, wherein the spacer layer is formed in a thickness filling a gap between neighboring pillar patterns.

15. The method of claim 12, wherein the etching of the spacer layer while leaving the spacer patterns behind on the sidewalls of the pillar patterns comprises a main etch process and an overetch process.

16. The method of claim 15, wherein the main etch process is performed using a mixed gas of fluoroform ($CHF_3$) and difluoromethane ($CH_2F_2$).

17. The method of claim 15, wherein the overetch process is performed using a mixed gas of tetrafluoromethane ($CF_4$) and $CHF_3$.

18. The method of claim 12, wherein in the etching of the spacer layer while leaving the spacer patterns behind on the sidewalls of the pillar patterns, the third mask layer and the second mask layer are removed.

19. The method of claim 18, wherein in the removing of the pillar patterns between the spacer patterns, the first mask pattern is removed.

20. The method of claim 19, wherein the removal of the first mask pattern is performed through an oxygen stripping method.

* * * * *